(12) United States Patent
Tsai et al.

(10) Patent No.: US 10,266,390 B2
(45) Date of Patent: *Apr. 23, 2019

(54) METHODS OF FORMING MICRO-ELECTRO-MECHANICAL DEVICES INCLUDING A CONDUCTIVE FEATURE EXTENDING THROUGH AN ESCORT RING

(71) Applicant: Taiwan Semiconductor Manufacturing Company, Ltd., Hsin-Chu (TW)

(72) Inventors: Shang-Ying Tsai, Pingzhen (TW); Hsin-Ting Huang, Bade (TW); Lung Yuan Pan, Hsin-Chu (TW); Jung-Huei Peng, Jhubei (TW); Hung-Hua Lin, Taipei (TW); Yao-Te Huang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 126 days.

This patent is subject to a terminal disclaimer.

(21) Appl. No.: 14/925,345

(22) Filed: Oct. 28, 2015

(65) Prior Publication Data

US 2016/0046482 A1    Feb. 18, 2016

Related U.S. Application Data

(60) Continuation of application No. 14/484,540, filed on Sep. 12, 2014, now Pat. No. 9,181,083, which is a
(Continued)

(51) Int. Cl.
*B81B 7/00* (2006.01)
*B81C 1/00* (2006.01)
(Continued)

(52) U.S. Cl.
CPC ........ *B81B 7/0006* (2013.01); *B81C 1/00039* (2013.01); *B81C 1/00134* (2013.01);
(Continued)

(58) Field of Classification Search
CPC ............... G01P 15/0802; G01P 15/125; G01P 2015/0871; H01G 5/18; H01L 28/60;
(Continued)

(56) References Cited

U.S. PATENT DOCUMENTS 5,847,454 A * 12/1998 Shaw ................... B81C 1/00142
257/734
7,657,995 B2 * 2/2010 Hsu .................... H01H 59/0009
29/622
(Continued)

*Primary Examiner* — Mohsen Ahmadi
*Assistant Examiner* — Scott E Bauman
(74) *Attorney, Agent, or Firm* — Slater Matsil, LLP

(57) ABSTRACT

A device includes a substrate, a routing conductive line over the substrate, a dielectric layer over the routing conductive line, and an etch stop layer over the dielectric layer. A Micro-Electro-Mechanical System (MEMS) device has a portion over the etch stop layer. A contact plug penetrates through the etch stop layer and the dielectric layer. The contact plug connects the portion of the MEMS device to the routing conductive line. An escort ring is disposed over the etch stop layer and under the MEMS device, wherein the escort ring encircles the contact plug.

20 Claims, 10 Drawing Sheets

Related U.S. Application Data division of application No. 13/450,728, filed on Apr. 19, 2012, now Pat. No. 8,853,801.

(51) Int. Cl.
| | |
|---|---|
| *H01G 5/18* | (2006.01) |
| *H01L 49/02* | (2006.01) |
| *G01P 15/08* | (2006.01) |
| *G01P 15/125* | (2006.01) |

(52) U.S. Cl.
CPC ...... *B81C 1/00166* (2013.01); *B81C 1/00341* (2013.01); *G01P 15/0802* (2013.01); *G01P 15/125* (2013.01); *H01G 5/18* (2013.01); *B81B 2203/0307* (2013.01); *G01P 2015/0871* (2013.01); *H01L 28/60* (2013.01)

(58) Field of Classification Search
CPC .......... B81B 7/0006; B81B 2203/0307; B81C 1/00039; B81C 1/00134; B81C 1/00166; B81C 1/00341
USPC ........................................................ 257/415
See application file for complete search history.

(56) References Cited

U.S. PATENT DOCUMENTS

| | | | |
|---|---|---|---|
| 9,181,083 B2* | 11/2015 | Tsai | ................. G01P 15/0802 |
| 2005/0032266 A1* | 2/2005 | Suzuki | ................. B81B 3/0054 |
| | | | 438/50 |
| 2007/0172975 A1* | 7/2007 | Tomomatsu | ........ B81C 1/00246 |
| | | | 438/52 |
| 2010/0207217 A1 | 8/2010 | Zuniga-Ortiz | |
| 2011/0180887 A1 | 7/2011 | Rothacher | |

\* cited by examiner

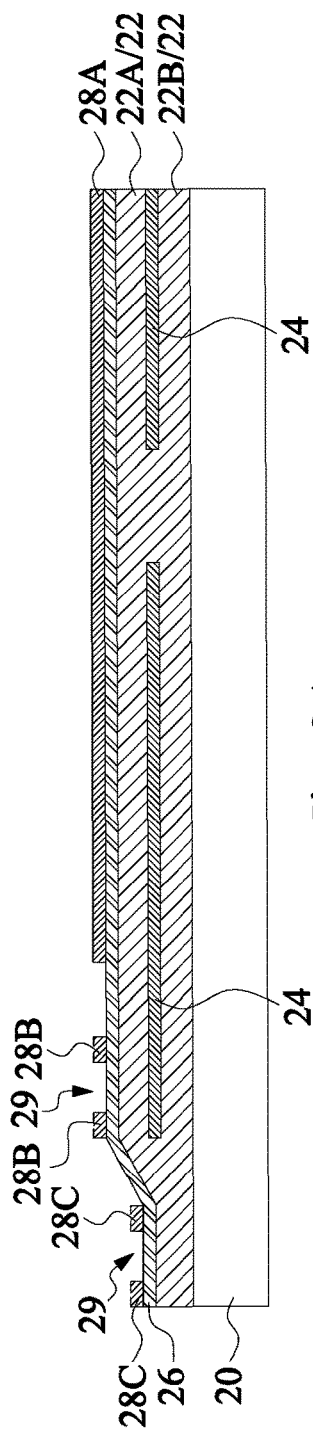
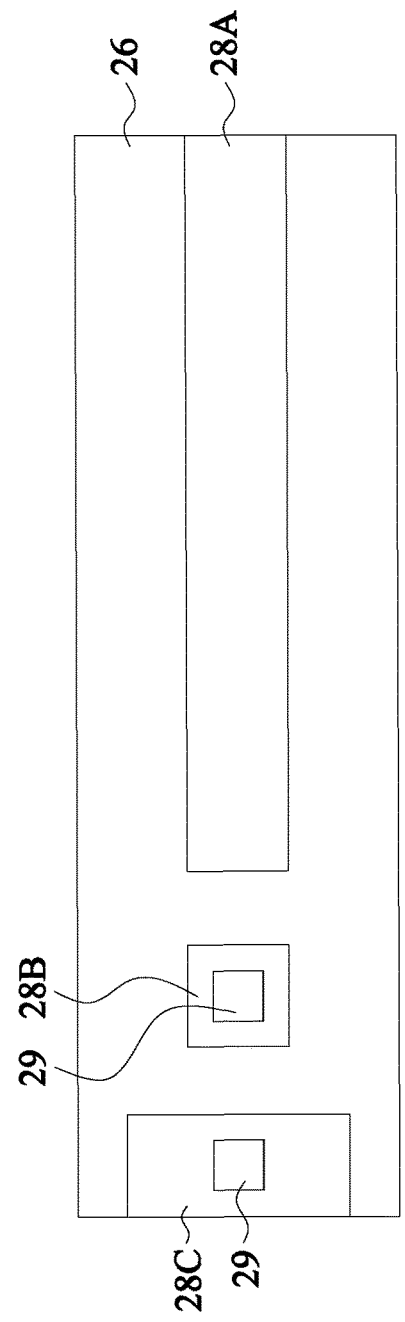
Fig. 2A
Fig. 2B

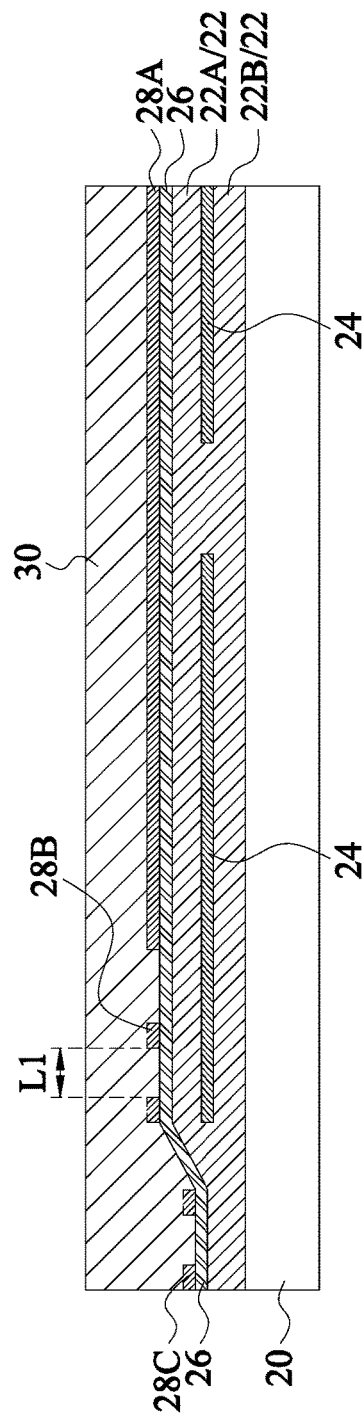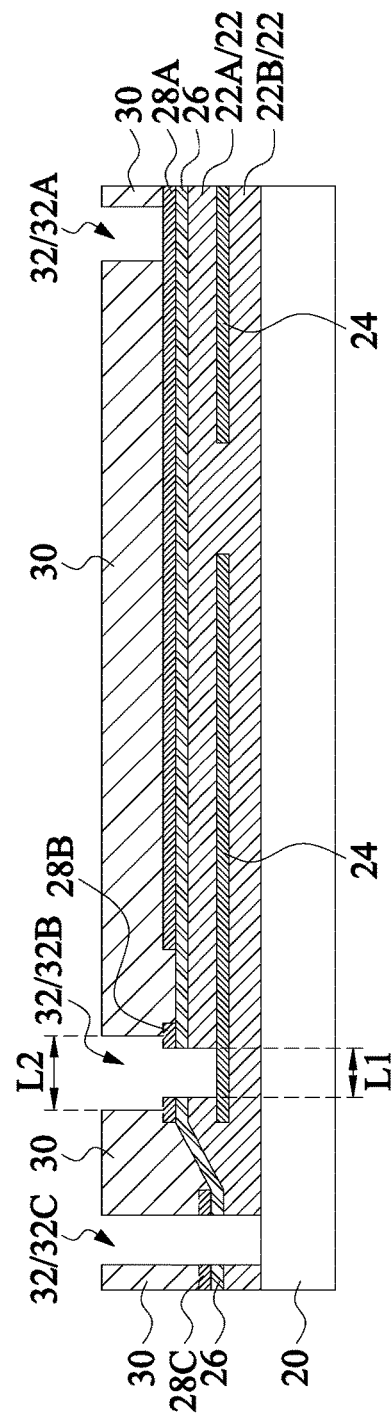
Fig. 3A
Fig. 3B

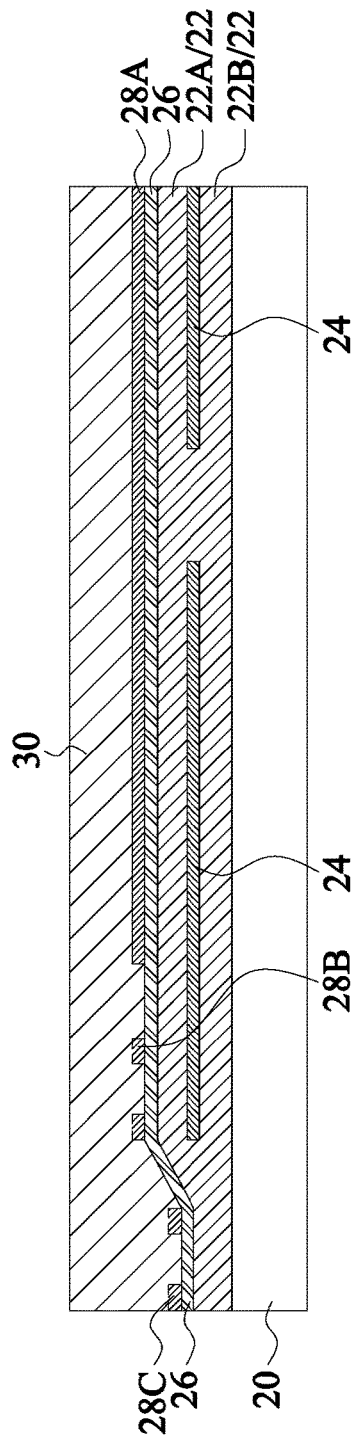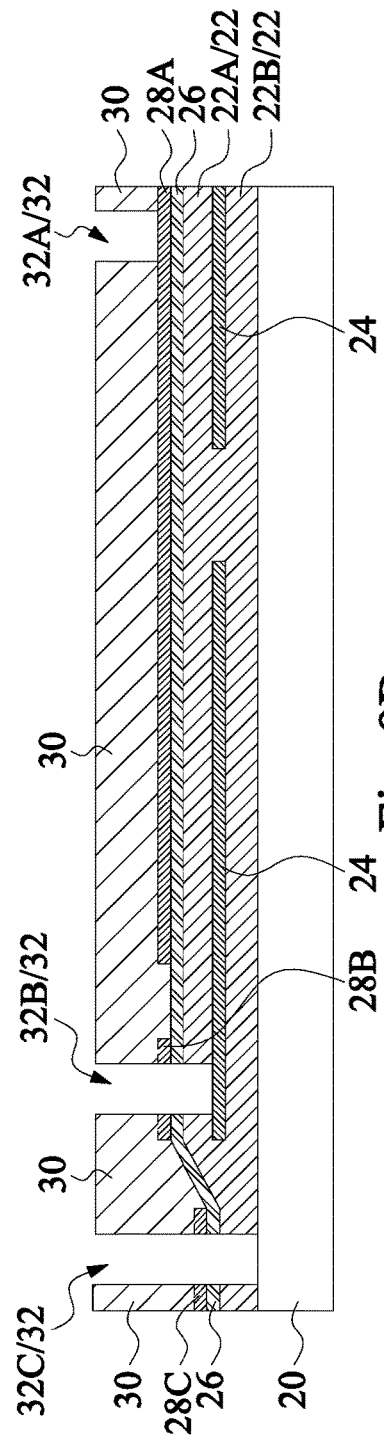

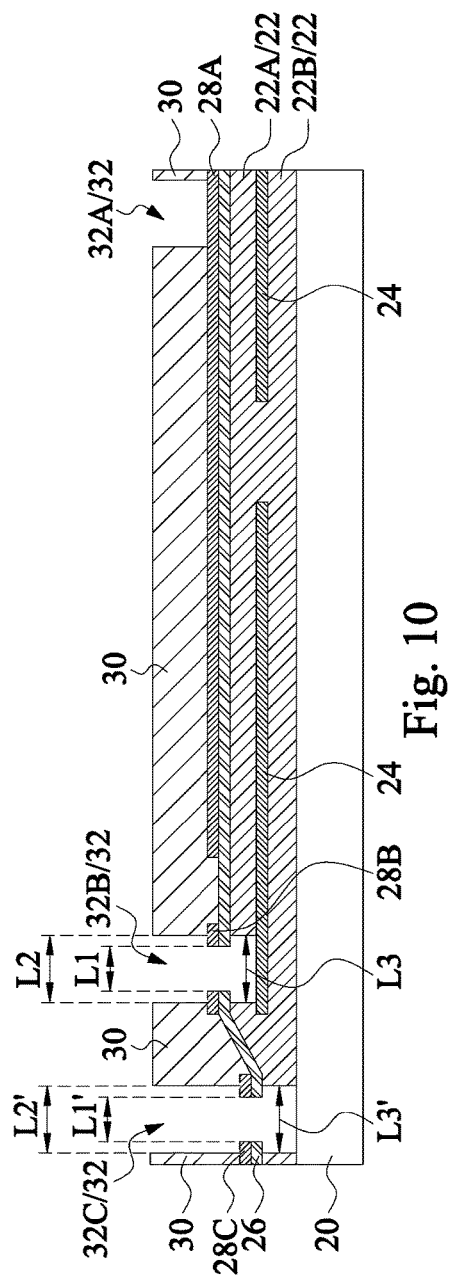
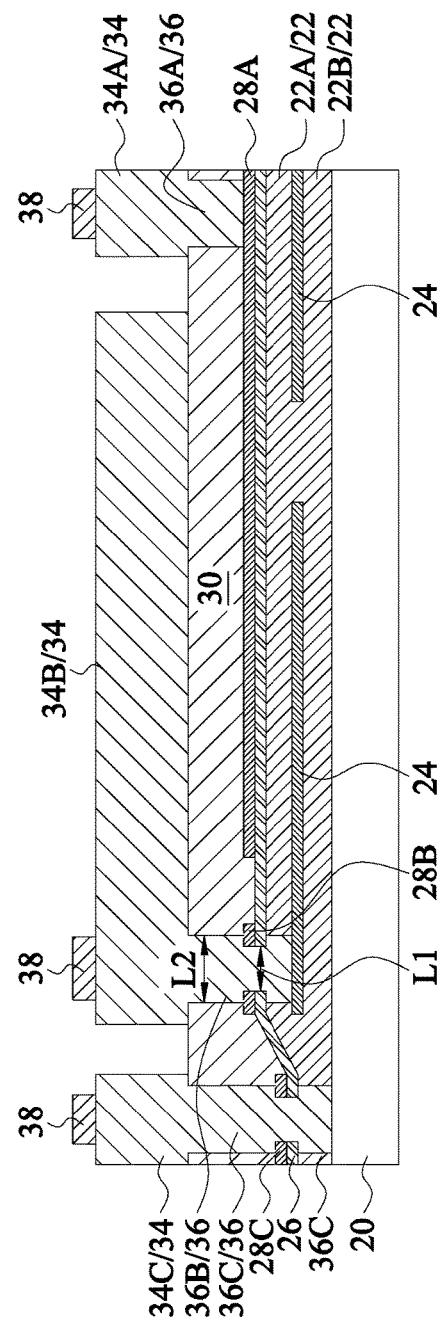
Fig. 10
Fig. 11

METHODS OF FORMING MICRO-ELECTRO-MECHANICAL DEVICES INCLUDING A CONDUCTIVE FEATURE EXTENDING THROUGH AN ESCORT RING

PRIORITY CLAIM AND CROSS-REFERENCE

This application is a continuation of U.S. patent application Ser. No. 14/484,540, entitled "MEMS Devices and Methods of Forming the Same," filed Sep. 12, 2014, which application is a divisional of U.S. patent application Ser. No. 13/450,728, entitled "MEMS Devices and Methods of Forming the Same," filed on Apr. 19, 2012, which applications are incorporated herein by reference.

BACKGROUND

Micro-Electro-Mechanical System (MEMS) devices may be used in various applications such as micro-phones, accelerometers, inkjet printers, etc. A commonly used type of MEMS devices includes a capacitive sensor, which utilizes a movable element (sometimes referred to as a proof mass) as a capacitor plate, and a fixed element as the other capacitor plate. The movement of the movable element causes the change in the capacitance of the capacitor. The change in the capacitance may be converted into the change in an electrical signal, and hence the MEMS device may be used as a microphone, an accelerometer, or the like. The movement of the movable element may also be used for squeezing the ink in an inkjet printer.

The MEMS devices may include polysilicon as the capacitor plates. The capacitor plates are anchored on the underlying layers such as polysilicon layers, the silicon substrate, or the like, through anchor structures. To form the air gap that is used to allow the proof mass to move, a sacrificial oxide layer is formed, on which the proof mass is formed. The sacrificial oxide layer is then removed. An etch stop layer is accordingly formed under the sacrificial oxide layer to prevent the oxide under the sacrificial layer from being etched. It has been found that the removal of the oxide layer often results in the undesirable undercuts to be formed, wherein the undercuts may be formed under the etch stop layer. The undercuts are adjacent to where the anchor structures penetrate through the etch stop layer. The formation of the undercuts may cause the weakening of the MEMS device, and may sometimes result in the failure of the MEMS device.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 1 through 6B are cross-sectional views of intermediate stages in the formation of MEMS devices in accordance with various exemplary embodiments; and FIGS. 7 through 12 illustrate cross-sectional views of intermediate stages in the formation of MEMS devices in accordance with various alternative embodiments.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

Micro-Electro-Mechanical System (MEMS) devices and the methods of forming the same are provided in accordance with various embodiments. The intermediate stages of forming the MEMS devices are illustrated. The variations of the embodiments are discussed. Throughout the various views and illustrative embodiments, like reference numbers are used to designate like elements.

Figure 1:
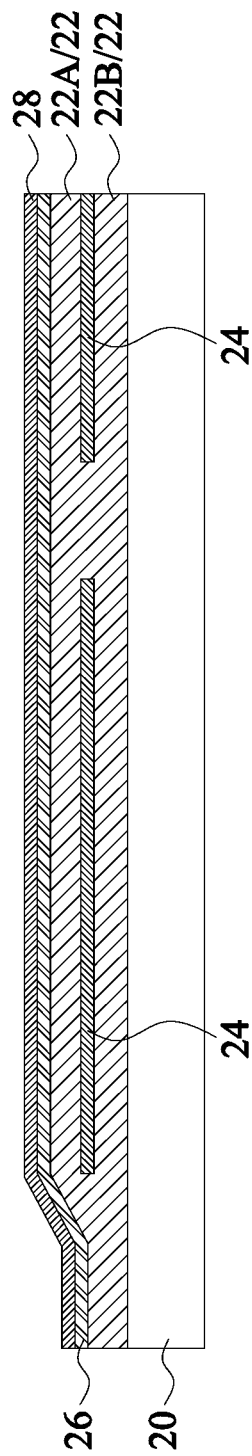

FIGS. 1 through 6B illustrate cross-sectional views and top views of the intermediate stages in the formation of MEMS devices in accordance with exemplary embodiments. Referring to FIG. 1, substrate 20 is provided. Substrate 20 may include a semiconductor material such as silicon, although other semiconductor materials may be used. Although not illustrated, active devices such as Metal-Oxide-Semiconductor (MOS) transistors may be formed at the top surface of substrate 20. Alternatively, no active devices are formed. Dielectric layers 22 are formed over the top surface of substrate 20. In some embodiments, dielectric layers 22 comprise silicon oxide, wherein the formation process may include thermally oxidizing a surface layer of substrate 20 and/or deposition processes. Accordingly, throughout the description, dielectric layers 22 are alternatively referred to as oxide layers 22, although other dielectric materials such as nitrides, carbides, oxynitrides, and/or the like, may be used to form dielectric layers 22.

Routing lines 24, which are conductive lines formed of polysilicon or metal(s), may be formed in dielectric layers 22. Dielectric layers 22 may include dielectric layer(s) 22A over routing lines 24 and dielectric layer(s) 22B under routing lines 24. Etch stop layer 26 is deposited on dielectric layer 22. In some embodiments, etch stop layer 26 comprises a low-stress nitride, and hence is referred to as low-stress nitride layer 26 hereinafter, although etch stop layer 26 may also be formed of other dielectric materials. The thickness of low-stress nitride layer 26 may be between about 1 kÅ and about 10 kÅ, for example. The deposition methods include Chemical Vapor Deposition (CVD) methods such as Low-Pressure CVD (LPCVD).

Next, conductive layer 28 is deposited, and is then patterned. In some embodiments, conductive layer 28 comprises polysilicon. In alternative embodiments, other conductive materials such as metals (for example, aluminum copper) may be used. The polysilicon in conductive layer 28 may be doped with a p-type or an n-type impurity to increase its conductivity.

Referring to FIG. 2A, conductive layer 28 is patterned. The remaining portions of conductive layer 28 include 28A, 28B, and 28C. Throughout the description, portions 28B and 28C are referred to as escort rings. Escort rings 28B and 28C may be separated from conductive portion 28A, and may be separate from each other. FIG. 2B illustrates a top view of the structure shown in FIG. 2A. In some embodiments, each of escort rings 28B and 28C encircles one of openings 29, through which the underlying low-stress nitride layer 26 is exposed. In alternative embodiments, portions 28B and 28C are solid pads that do not have openings therein. In these embodiments, the openings in solid pads 28B and 28C are formed in the step shown in FIGS. 3A and 3B.

FIGS. 3A and 3B illustrate the formation of sacrificial layer 30 over conductive portions 28A, 28B, and 28C and etch stop layer 26 (as shown in FIG. 3A). In some embodiments, sacrificial layer 30 comprises silicon oxide. The thickness of sacrificial layer 30 may be between about 0.2 kÅ and about 100 kÅ, for example. Sacrificial layer 30 is then etched, and via openings 32 (including 32A, 32B, and 32C) are formed in sacrificial layer 30 (as shown in FIG. 3B). Furthermore, low-stress nitride layer 26 and dielectric layers 22 that are underlying openings 29 are also etched. In some embodiments, the etchant is selected so that the etchant does not attack conductive portions 28A/28B/28C, routing line 24 (which may be formed of polysilicon, for example), and substrate 20 (which may be formed of silicon). Accordingly, openings 32B and 32 are configured to be aligned to, and have the same sizes and shapes as, openings 29 in escort rings 28B and 28C, respectively. In some exemplary embodiments, the etchant may include $Cl_2$, $O_2$, $SF_6$, $BCl_3$, HBr, and combinations thereof. Other gases such as Ar, $N_2$, He, and combinations thereof may also be added. In the illustrated exemplary embodiments, conductive portion 28A, routing line 24, and substrate 20 are exposed through via openings 32A, 32B, and 32C, respectively.

As shown in FIG. 3B, in some embodiments, opening 32 includes a first portion in conductive portions 28A, low-stress nitride layer 26, and dielectric layers 22 and a second portion in sacrificial layer 30. The first portion has lateral size L1, and the second portion has lateral size L2. Lateral size L2 is greater than lateral size L1 by a difference, which may be between about 100 Å and about 5,000 Å. The difference (L2-L1) may also be between about 500 Å and 2,000 Å.

The etching may be an anisotropic etching such as a dry etching. In the embodiments wherein openings 29 are pre-formed (as shown in FIGS. 2A and 2B), the etching may be a single-step etching, which stops on conductive portion 28A, routing line 24, and substrate 20. In alternative embodiments wherein portions 28B and 28C are solid pads with no openings 29 pre-formed therein, the formation of openings 32B and 32C may need more than one etching step, and may be performed in steps that are separate from the formation of opening 32A.

Figure 4:
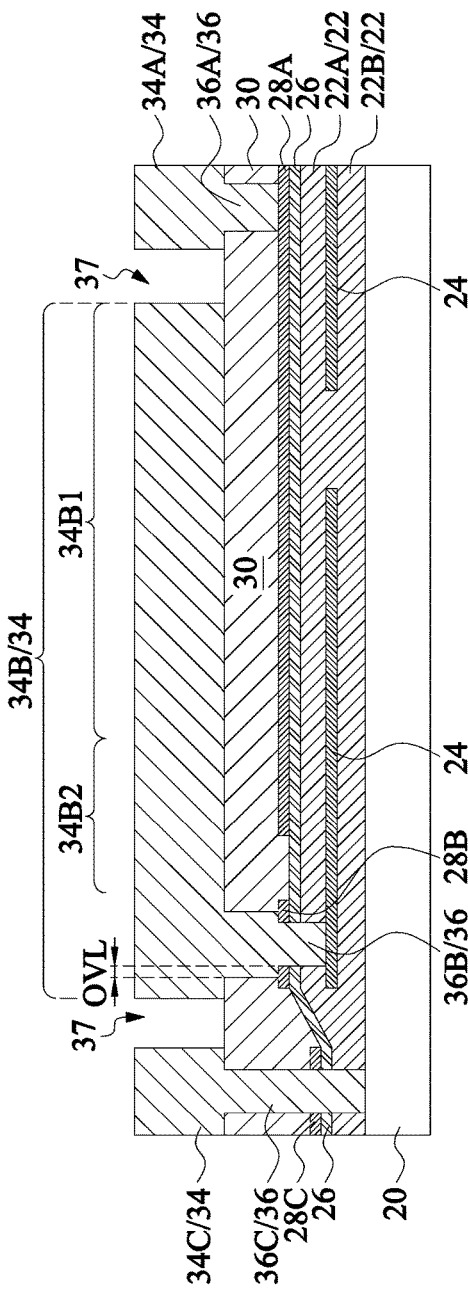

FIG. 4 illustrates the deposition and the patterning of a conductive material, so that conductive patterns 34 (including 34A, 34B, and 34C, for example) are formed. The conductive material is filled into via openings 32 (illustrated in FIG. 3B) to form contact plugs 36 (including 36A, 36B, and 36C). Conductive pattern 34B may further include proof mass 34B1 and spring 34B2. Contact plugs 36A, 36B, and 36C may electrically couple conductive patterns 34A, 34B, and 34C to conductive portion 28A, routing line 24, and substrate 20, respectively. In some embodiments, the conductive material comprises polysilicon, which is doped with a p-type or an n-type impurity to increase its conductivity. The conductivity of the doped impurity is the same as that of substrate 20. The thickness of conductive patterns 34 may be greater than about 1p.m, and may be between about 1μm and about 5μm, for example. Openings 37 are formed, and sacrificial layer 30 is exposed through openings 37. In the embodiments wherein lateral size L2 (FIG. 3B) is greater than L1, the upper portion of contact plug 36B in sacrificial layer 30 overlaps the edge portion of low-stress nitride layer 26, with the overlapping width being marked as OVL. In some embodiments, the portion of contact plug 36B that overlaps low-stress nitride layer 26 forms a ring.

Figure 5:
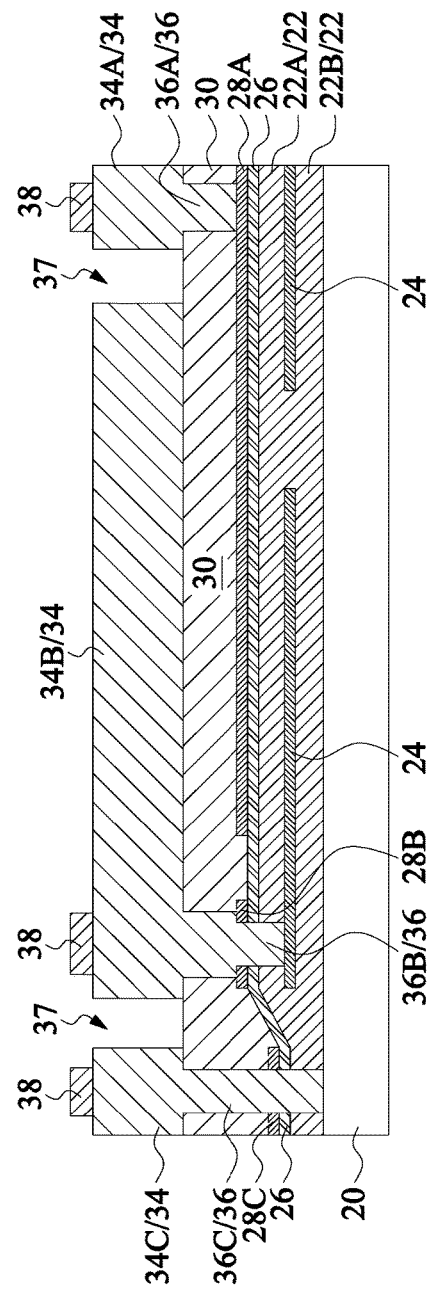

FIG. 5 illustrates the formation of pads 38, which may be used for bonding a cap (not shown) onto the structure shown in FIG. 4. The bonding may be a eutectic bonding. Accordingly, the material of pads 38 may include aluminum, germanium, indium, gold, tin, and/or the like, which are suitable for forming eutectic alloys. Alternatively, pads 38 may be used for forming electrical connections (such as wire bonds) to electrically connect to conductive patterns 34. Accordingly, pads 38 may comprise aluminum, copper, gold, palladium, nickel, and/or the like.

Figure 6A:
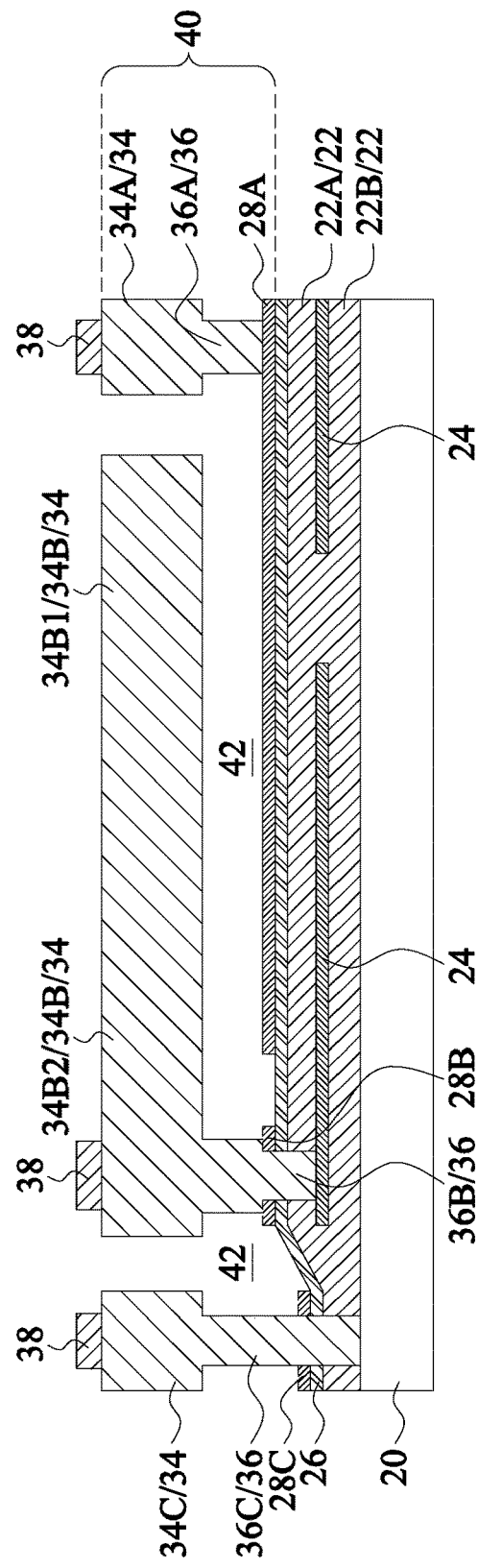

FIG. 6A illustrates the removal of sacrificial layer 30 through openings 37. The space left by sacrificial layer 30 is referred to air gap 42 hereinafter. The material of sacrificial layer 30 may be selected so that there is a high etching selectivity between sacrificial layer 30 and conductive portions 28A, 28B, and 28C. Accordingly, sacrificial layer 30 is etched without the substantial etching of conductive portions 28A, 28B, and 28C. Furthermore, there is a high etching selectivity between sacrificial layer 30 and low-stress nitride layer 26, and hence oxide layers 22 are protected by low-stress nitride layer 26.

In some embodiments, sacrificial layer 30 is formed of silicon oxide, and hence may be etched using vapor Hydrogen Fluoride (HF). Alternatively, an HF solution is used to etch sacrificial layer 30, followed by a drying process. Escort rings 28B and 28C are in contact with the respective contact plugs 36B and 36C, respectively, with no gaps therebetween. This may be partially due to that escort rings 28B and 28C are formed of a same material as contact plugs 36B and 36C, and hence escort rings 28B and 28C may join the respective contact plugs 36B and 36C tightly with no gap formed therebetween. Furthermore, the formation of escort rings 28B and 28C results in the increase in the traveling path of the etchant if the etchant is to travel to dielectric layers 22 through the gaps (if any) between components 28B/28C/26 and contact plugs 36B and 36C. Accordingly, the etchant is unlikely to reach dielectric layers 22 to form undercuts underlying low-stress nitride layer 26.

After the removal of sacrificial layer 30, conductive pattern 34B may be spaced apart from the underlying conductive portion 28A. Accordingly, proof mass 34B1 and conductive portion 28A form two capacitor plates of a capacitor, which is a part of MEMS device 40. In addition, the capacitance between conductive patterns 34B and 34C may also form a capacitor of MEMS device 40 in some exemplary embodiments. Due to the existence of the space between conductive pattern 34A and conductive portion 28A, proof mass 34B1 is movable in air gap 42.

Figure 6B:
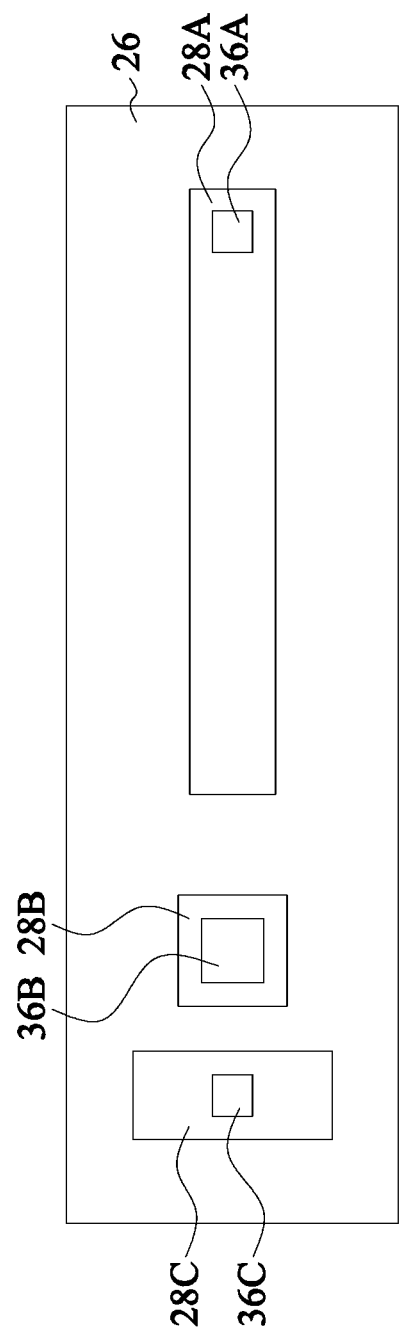

FIG. 6B illustrates a top view of the structure shown in FIG. 6A, wherein low-stress nitride layer 26, conductive portion 28A, escort rings 28B and 28C, and contact plugs 36A, 36B, and 36C are illustrated, and other components are not shown. As is shown in FIGS. 6A and 6B, escort rings 28B and 28C may encircle, and may physically join, contact plugs 36B and 36C, respectively, Accordingly, when the MEMS device 40 in FIG. 6A is operated, escort rings 28B and 28C may have the same voltage levels as contact plugs 36B (and proof mass 34B1) and 36C respectively.

FIGS. 7 through 12 illustrate cross-sectional views of intermediate stages in the formation of MEMS devices in accordance with alternative embodiments. Unless specified otherwise, the materials and formation methods of the components in these embodiments are essentially the same as the like components, which are denoted by like reference numerals in the embodiments shown in FIGS. 1 through 6B. The details of the like components shown in FIGS. 7 through 12 may thus be found in the discussion of the embodiment shown in FIGS. 1 through 6B.

Figure 7:
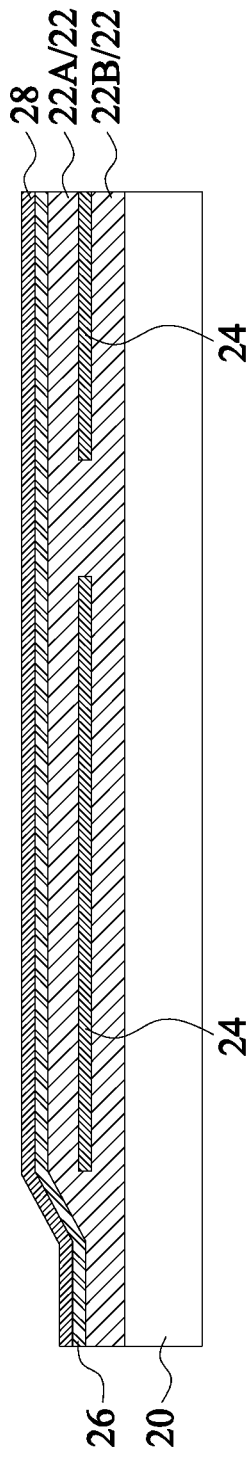
Figure 8:
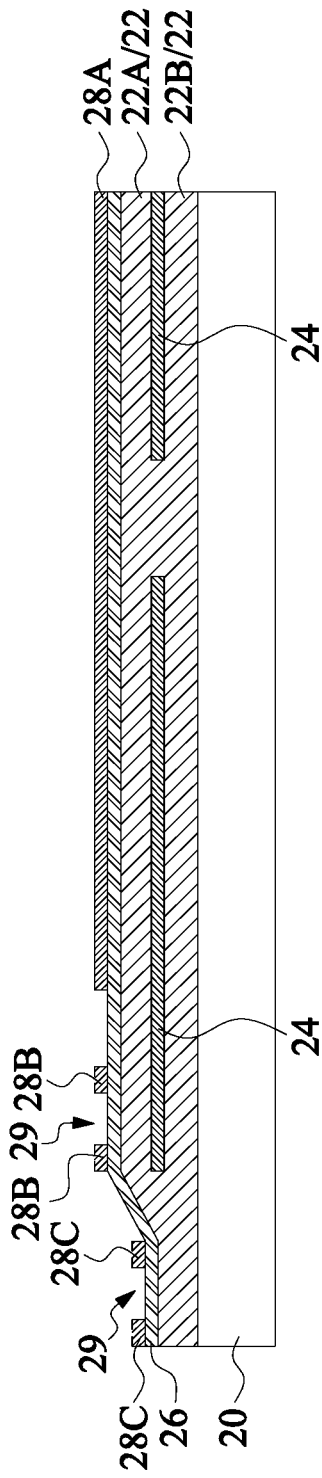

The initial steps of these embodiments are shown in FIG. 7, which steps are essentially the same as those shown in FIG. 1. Next, as shown in FIG. 8, conductive layer 28 is formed and patterned. In some embodiments, the patterned conductive layer 28 includes portion 28A, and does not include escort rings 28B and 28C. In alternative embodiments, the patterned conductive layer 28 further includes portion 28A and escort rings 28B and 28C. Throughout the drawings, escort rings 28B and 28C are illustrated using dashed lines to indicate that they may be, or may not be, formed.

FIGS. 9A and B illustrates the formation of sacrificial layer 30 (as shown in FIG. 9A) and an etch step for forming via openings 32 (including 32A, 32B, and 32C) (as shown in FIG. 9B). The etch step may be performed through an anisotropic etch such as a dry etch. Similarly, when escort rings 28B and 28C and the respective openings 29 are formed, the etching of sacrificial layer 30 may be a single-step etching that automatically stops on conductive portion 28A, routing line 24, and substrate 20. Otherwise, when escort rings 28B and 28C are formed while openings 29 are not formed, more than one etching step may need to be performed to form openings 32B and 32C. When escort rings 28B and 28C are not formed, a single-step etching may be performed to form via openings 32.

Next, as shown in FIG. 10, a lateral etch, which may be an isotropic etch, is performed to expand openings 32 laterally. In some embodiments, the lateral etch is performed by dipping the structure shown in FIG. 9B in an etchant that attacks dielectric layers 22 and/or sacrificial layer 30, and does not attack low-stress nitride layer 26, conductive portion 28, escort rings 28B/28C (if any), and routing line 24 significantly, although low-stress nitride layer 26 may have some thickness lost. The dipping time may be controlled, so that lateral sizes L2 and L3 are greater than lateral size L1 by a difference between about 100 Å and about 5,000 Å. The difference (L2-L1) or (L3-L1) may also be between about 500 Å and 2,000 Å. Similarly, lateral sizes L2' and L3' are also greater than lateral size L1' by a difference between about 100 Å and about 5,000 Å. The difference (L2'-L1') or (L3'-L1') may also be between about 500 Å and 2,000 Å. It is realized, however, that the dimensions recited throughout the description are merely examples, and may be changed to different values. Since the etching is isotropic, the expanding distances of openings 32 in all directions that are parallel to the top surface of substrate 20 may be the same.

Figure 12:
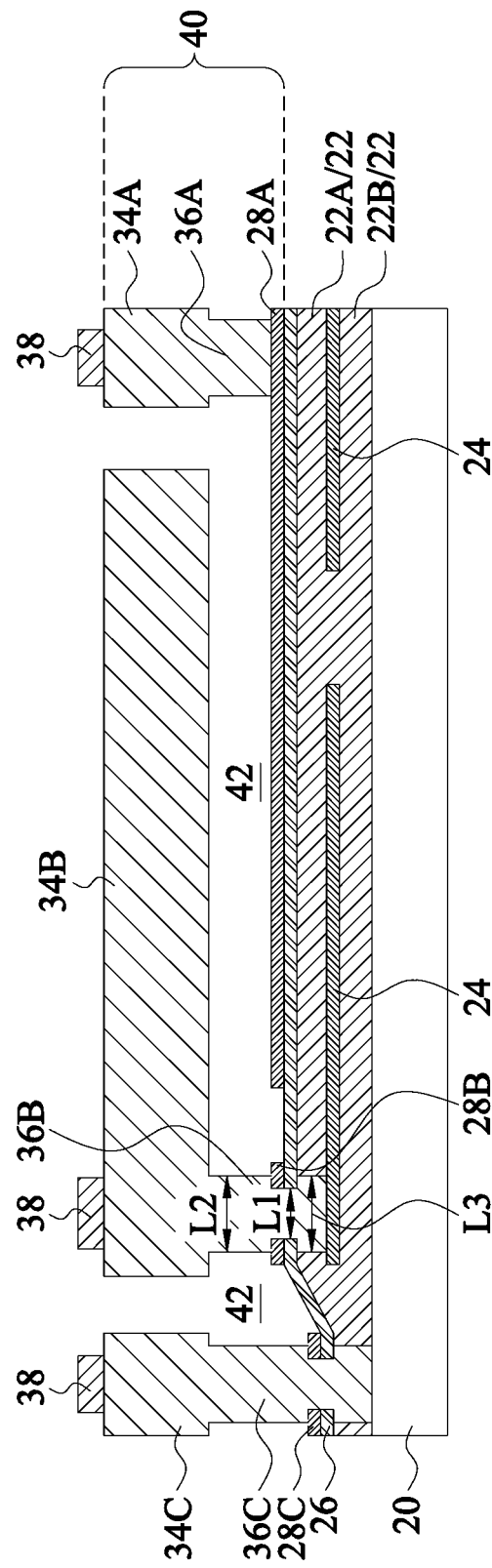

Next, referring to FIG. 11, contact plugs 36 and conductive patterns 34 are formed. Pads 38 are also formed. In FIG. 12, sacrificial layer 30 is removed, for example, using vapor HF or an HF solution. Air gap 42 is thus formed. In the resulting structure, contact plugs 36 have lateral sizes L1, L2, and L3, wherein lateral size L1 is the size of the portion (a first portion) of contact plugs 36 in low-stress nitride layer 26, lateral sizes L2 is the portion (a second portion) of contact plugs 36 in dielectric layers 22 and air gap 42, and lateral sizes L3 is the portion (a third portion) of contact plugs 36 in dielectric layers 22. The second and the third portions of contact plugs 36 also laterally expand beyond edges of the first portion in all lateral direction, and with substantially the same distance. Furthermore, the second portion of contact plugs 36 may overlap low-stress nitride layer 26, and the overlapped portion may form a ring, with the width of the ring being equal to about (L2-L1)/2, for example. Accordingly, the edge portions of contact plugs 36 overlap low-stress nitride layer 26, and a better sealing of dielectric layers 22 is achieved.

In the embodiments, by forming escort rings or laterally expand contact plugs 36 to overlap low-stress nitride layer 26, the undesirable formation of undercuts in dielectric layers 22 is at least reduced, and may be substantially eliminated.

In accordance with embodiments, a device includes a substrate, a routing conductive line over the substrate, a dielectric layer over the routing conductive line, and an etch stop layer over the dielectric layer. A MEMS device has a portion over the etch stop layer. A contact plug penetrates through the etch stop layer and the dielectric layer. The contact plug connects the portion of the MEMS device to the routing conductive line. An escort ring is disposed over the etch stop layer and under the MEMS device, wherein the escort ring encircles the contact plug.

In accordance with other embodiments, a device includes a substrate, a routing conductive line over the substrate, a dielectric layer over the routing conductive line, and an etch stop layer over the dielectric layer. A MEMS device has a first portion over the etch stop layer. A contact plug penetrates through the etch stop layer and the dielectric layer. The contact plug is electrically coupled to the routing conductive line. The contact plug includes a first portion in the etch stop layer, wherein the first portion has a first lateral dimension. The contact plug further includes a second portion over the first portion, wherein the second portion of the contact plug has a second lateral dimension. The contact plug further includes a third portion underlying the first portion and in the dielectric layer. The third portion of the contact plug has a third lateral dimension. One of the second and the third lateral dimensions is greater than the first lateral dimension.

In accordance with yet other embodiments, a method includes forming a routing conductive line over a substrate, forming a dielectric layer over the routing conductive line, forming an etch stop layer over the dielectric layer, forming an escort ring over the etch stop layer, and forming a sacrificial layer over the escort ring. An opening is formed in the sacrificial layer, the escort ring, the etch stop layer, and the dielectric layer, wherein the routing conductive line is exposed through the opening. A contact plug is formed in the opening. A conductive component is formed over and connected to the contact plug, wherein the conductive component forms a portion of a MEMS device. The sacrificial layer is then removed, and an air gap is left by the removed sacrificial layer.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
   forming a sacrificial layer over a first escort ring, the first escort ring comprising a conductive material;
   etching-through a portion of the sacrificial layer encircled by the first escort ring to form an opening, with a routing conductive line underlying the first escort ring exposed to the opening;

after etching-through the portion of the sacrificial layer, forming a conductive feature, wherein the conductive feature comprises:
  a contact plug extending into the opening and contacting a top surface of the routing conductive line; and
  a conductive line having a bottom connected to a top of the contact plug, wherein the sacrificial layer encircles the contact plug, and has a top surface contacting the bottom of the conductive line; and
removing the sacrificial layer to form an air gap.

2. The method of claim 1, wherein the conductive line forms a portion of an upper capacitor plate of a Micro-Electro-Mechanical System (MEMS) device, and the method further comprises:
  forming a conductive layer; and
  patterning the conductive layer to form the first escort ring and a lower capacitor plate of the MEMS device.

3. The method of claim 2 further comprising:
  etching-through the sacrificial layer to form an additional opening, wherein a top surface of the lower capacitor plate is exposed through the addition opening; and
  forming an additional contact plug in the additional opening.

4. The method of claim 3, wherein the opening and the additional opening are formed simultaneously, and a first bottom surface of the opening and a second bottom surface of the additional opening are at different levels.

5. The method of claim 1 further comprising forming a through-opening penetrating through the sacrificial layer and a second escort ring, wherein a semiconductor substrate is exposed to the through-opening.

6. The method of claim 1, wherein the opening is formed through an anisotropic etching, and wherein the method further comprises, after the anisotropic etching, performing an isotropic etching to expand lateral sizes of the opening.

7. The method of claim 6, wherein during the isotropic etching, the first escort ring is substantially not etched.

8. The method of claim 6, wherein the isotropic etching results in the opening to have a first width measured at a same level as the first escort ring, a second width higher than the first escort ring, and a third width lower than the first escort ring, and the second width and the third width are greater than the first width.

9. The method of claim 1, wherein the opening stops on a top surface of the routing conductive line.

10. A method comprising:
  forming a routing conductive line over a semiconductor substrate;
  forming a dielectric layer over the routing conductive line;
  forming a conductive pad over the dielectric layer;
  forming a sacrificial layer over the conductive pad and the dielectric layer;
  etching the sacrificial layer to form an opening extending from a top surface of the sacrificial layer to the routing conductive line, wherein the opening penetrates through a center portion of the conductive pad, with portions of the conductive pad encircling the opening forming an escort ring;
  depositing a conductive material to form a conductive feature, with a first portion of the conductive material filling the opening; and
  removing the sacrificial layer to form an air gap underlying the conductive feature.

11. The method of claim 10, wherein the conductive material further comprises a second portion having a bottom contacting a top of the first portion, wherein the second portion has a bottom surface in contact with a top surface of the sacrificial layer.

12. The method of claim 10, wherein during the etching the sacrificial layer, the escort ring acts as an etch stop layer.

13. The method of claim 10, wherein the opening comprises a first portion over the escort ring and having a first lateral dimension, and a second portion extending from a top surface of the escort ring to the routing conductive line, with the second portion of the opening having a second lateral dimension smaller than the first lateral dimension.

14. The method of claim 10 further comprising, after the forming the opening, expanding a lateral dimension of a lower portion of the opening, with the lower portion of the opening being lower than the escort ring.

15. The method of claim 10, wherein before the etching the sacrificial layer to form the opening, the conductive pad has a shape of a ring, and after the sacrificial layer is etched through, the dielectric layer is etched, with the conductive pad acting as an etching mask for etching the dielectric layer.

16. A method comprising:
  forming a routing conductive line in a dielectric layer, the routing conductive line and the dielectric layer being disposed over a semiconductor substrate, a portion of the dielectric layer being interposed between the semiconductor substrate and the routing conductive line;
  forming an escort ring over the routing conductive line;
  forming a sacrificial layer over the escort ring, the routing conductive line, and the dielectric layer, wherein a portion of the sacrificial layer is filled into a space encircled by the escort ring;
  etching the sacrificial layer to form a first opening and a second opening simultaneously, wherein the first opening extends from a top surface of the sacrificial layer to the routing conductive line over the semiconductor substrate, and the second opening extends from the top surface of the sacrificial layer to the semiconductor substrate;
  filling the first opening and the second opening with a conductive material; and
  removing the sacrificial layer.

17. The method of claim 16, wherein during the etching the sacrificial layer, an inner ring portion of the escort ring acts as an etch stop layer.

18. The method of claim 16, wherein the first opening comprises a first portion over the escort ring and having a first lateral dimension, and a second portion extending from a top surface of the escort ring to the semiconductor substrate, with the second portion having a lateral dimension smaller than the first lateral dimension.

19. The method of claim 16 further comprising, after the forming the first opening, expanding a lateral dimension of a lower portion of the first opening, with the lower portion of the first opening being lower than the escort ring.

20. The method of claim 16, wherein the opening comprises a third lateral dimension level with the escort ring and a fourth lateral dimension below the escort ring, the fourth lateral dimension being greater than the third lateral dimension.

* * * * *